United States Patent
Lin et al.

(10) Patent No.: US 7,205,632 B2
(45) Date of Patent: Apr. 17, 2007

(54) ANTI-SCATTERING ATTENUATOR STRUCTURE FOR HIGH ENERGY PARTICLE RADIATION INTO INTEGRATED CIRCUITS

(75) Inventors: Wen-Chin Lin, Hsin-Chu (TW); Denny D. Tang, Saratoga, CA (US); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 340 days.

(21) Appl. No.: 10/818,009

(22) Filed: Apr. 5, 2004

(65) Prior Publication Data

US 2005/0227493 A1    Oct. 13, 2005

(51) Int. Cl.
*H01L 29/00* (2006.01)

(52) U.S. Cl. .................. 257/531; 257/523; 438/407
(58) Field of Classification Search .............. 257/523, 257/531; 438/528
See application file for complete search history.

(56) References Cited

U.S. PATENT DOCUMENTS

| 4,124,826 | A | 11/1978 | Dixon et al. |
|---|---|---|---|
| 4,352,835 | A | 10/1982 | Holbrook et al. |
| 4,806,497 | A | 2/1989 | Adam et al. |
| 4,987,087 | A | 1/1991 | Voss |
| 5,017,508 | A | 5/1991 | Dodt et al. |
| 6,046,109 | A * | 4/2000 | Liao et al. .................. 438/689 |
| 6,100,118 | A * | 8/2000 | Shih et al. .................. 438/132 |
| 6,124,624 | A | 9/2000 | Van Roosmalen et al. |
| 6,214,750 | B1 | 4/2001 | Liao |
| 6,355,493 | B1 | 3/2002 | Usenko |
| 6,489,666 | B1 | 12/2002 | Yamaguchi et al. |
| 6,535,101 | B1 | 3/2003 | Ahn et al. |
| 7,075,167 | B2 * | 7/2006 | Harris et al. ................. 257/531 |

* cited by examiner

*Primary Examiner*—Anh D. Mai
*Assistant Examiner*—Brian E. Kunzer
(74) *Attorney, Agent, or Firm*—Haynes and Boone, LLP

(57) ABSTRACT

A microelectronics device including a semiconductor device located at least partially over a substrate, a bombarded area located at least partially over the substrate and adjacent the semiconductor device, and a bombarded attenuator interposing the semiconductor device and the bombarded area.

23 Claims, 3 Drawing Sheets

ANTI-SCATTERING ATTENUATOR STRUCTURE FOR HIGH ENERGY PARTICLE RADIATION INTO INTEGRATED CIRCUITS

BACKGROUND

The protection of surfaces or structures fabricated on a semiconductor substrate from radiation employed during fabrication have been a common practice throughout semiconductor technology. That is, during proton implantation and other radiation procedures employed in the manufacture of semiconductor devices, scattered beta, proton, x-ray and gamma particles can damage previously formed semiconductor devices. For example, the scattered particles can introduce defects in the crystalline lattice of doped regions of the devices, and can also cause charge build-up in the doped regions and the gate components. A high flux of ionizing radiation can also induce positive charge in various dielectric regions of a semiconductor device, thereby inducing parasitic transistors which conduct when actual operating transistors are not conducting. Consequently, semiconductor device components and surfaces may be protected by employing one or more photo-sensitive layers, oxides or other hard mask layers, and/or by introducing impurities into one or more features, thereby electrically isolating one region from scattered radiation while other regions on a semiconductor substrate are intentionally irradiated.

One common protection scheme includes fabricating a region of electrical isolation or protection by the impingement of ionizing radiation. Patterned portions of a semiconductor device may be exposed to an ionizing radiation source such as an ion or proton beam. The open patterned areas can be implanted with an impurity to create defect interstitials that change the electrical properties of an open patterned semiconductor device. During the radiation process, ionizing radiation scatters throughout the microelectronics device such that some un-targeted regions of the microelectronics device are exposed to the ionizing radiation. The scattered radiation can irrevocably damage the microelectronics device.

Another technique to minimize or reduce the effect of scattered ionizing radiation is to increase the distance between the targeted region from the un-targeted region. However, the increased distance or spacing reduces the overall area of the semiconductor substrate and reduces the allowable device area density. Moreover, such protection schemes become increasingly challenging as scaling continues to shrink device geometries.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
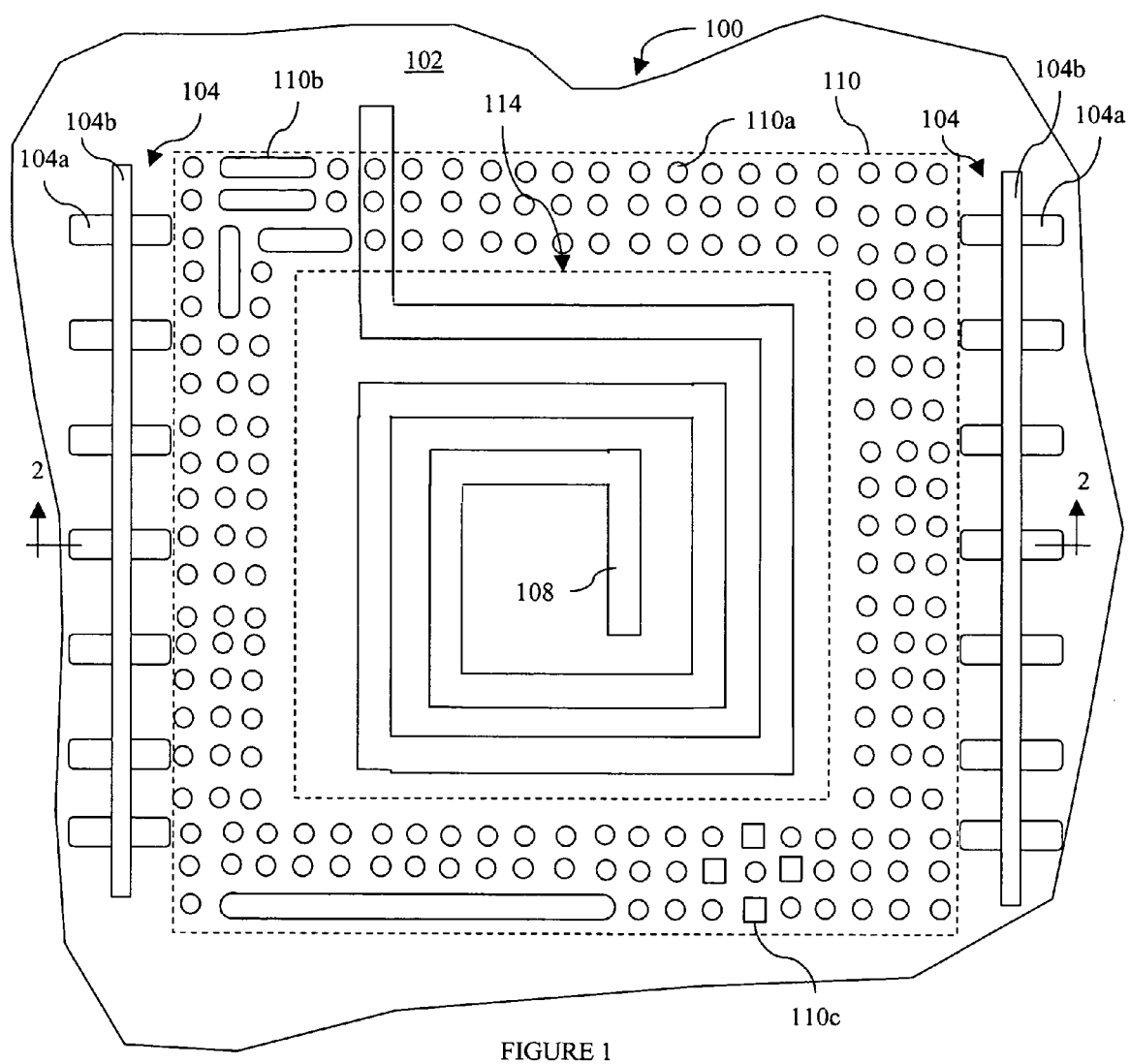
FIG. 1 is a plan view of one embodiment of an integrated circuit device constructed according to aspects of the present disclosure.

The present disclosure relates generally to microelectronics devices, including those manufactured by processes employing radiation bombardment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a plan view of one embodiment of an integrated circuit device 100 constructed according to aspects of the present disclosure. The integrated circuit device 110 is one environment in which a microelectronics device constructed according to aspects of the present disclosure may be implemented. The integrated circuit device 100 includes a substrate 102 and one or more transistors or other semiconductor devices 104 (hereafter collectively referred to as transistors 104) formed at least partially over the substrate 102. For example, each of the semiconductor devices 104 may include source/drain regions 104a formed in the substrate 102 and gate electrodes 104b formed over the substrate 102. The transistors 104 may be field effect transistors (FETs), bi-polar junction FETs, split gate FETs and/or other transistor devices. The transistors 104 may also include memory devices, such as SDRAM, DRAM, EPROM, EEPROM and other memory cells.

The substrate 102 may comprise single crystal silicon, silicon, sapphire, GaAs or other group II/IV and/or group III/V compound semiconductors, plastic, diamond or other conventional or future-developed materials. The substrate 102 may also be a conventional silicon-on-insulator (SOI) substrate, possibly having a silicon or germanium epitaxial layer formed on an insulator layer over a substrate comprising silicon or sapphire. The substrate 102 may also be a component of a an assembled integrated circuit device, and as such is not limited to comprising the bottom-most layer of the integrated circuit device 100 or another device incorporating the integrated circuit device 100.

The integrated circuit device 100 also includes at least one radiation region 114 located over and/or in the substrate 102 and adjacent at least one of the transistors 104. The radiation region 114 may be a bombarded area (bombardment area) of the device 100 and, as such, the terms radiation region and bombarded area may be used interchangeably herein. The radiation region 114 may be formed by beam ion implantation, plasma source ion implantation or other radiation methods. In one embodiment, forming the radiation region 114 may employ a high energy (e.g., MeV) proton bombardment source. As discussed below, the radiation region 114 may also be formed by employing a mask having one or more openings substantially conforming to the desired shape of the radiation region 114.

In general, the radiation region 114 may have electrical characteristics that are different from immediately adjacent materials. For example, the radiation region 114 may have a dielectric constant that varies from that of the immediately adjacent portions of the substrate 102 and/or the transistors 104, possibly attributable to a desired doping profile or implanted ion concentration of the radiation region 114 or the transistors 104. In one embodiment, the radiation region 114 has a higher resistivity that adjacent or proximate portions of the substrate 102 and/or transistors 104.

The radiation region 114 may be employed to improve the quality factor or other electrical characteristics of an inductor 108 formed over the radiation region 114. The inductor 108 also contemplates other components which may be employed with the transistors 104 on a common substrate, including other inductive elements, resonators, couplers, transformers, MEMS components and other devices. However, for the purpose of clarity, these components are collectively referred to hereafter as the inductor 108.

The integrated circuit device 100 also includes at least one radiation attenuator 110 (bombarded or bombardment attenuator) formed over and/or in the substrate 102 and adjacent at least one of the transistors 104. In general, the radiation attenuator 110, or portions thereof, interposes at least one of the transistors 104 and the radiation region 114. For example, as in the illustrated embodiment, the radiation attenuator 110 may substantially encompass the radiation region 114 and neighbor the transistors 104. Thus, in one embodiment, the radiation attenuator 110 has an annulus shape.

The radiation attenuator 110 may include metal plugs 110a and/or trenches 110b. The cross-sectional shapes of the plugs 110a and trenches 110b may have substantially round corners, although ones 110c of the plugs 110a and/or the trenches 110b may have substantially square corners. The plugs 110a and trenches 110b may be uniformly arranged, possibly being separated by a constant pitch ranging between about 35 nm and about 100 μm, or may be randomly arranged.

Figure 2:
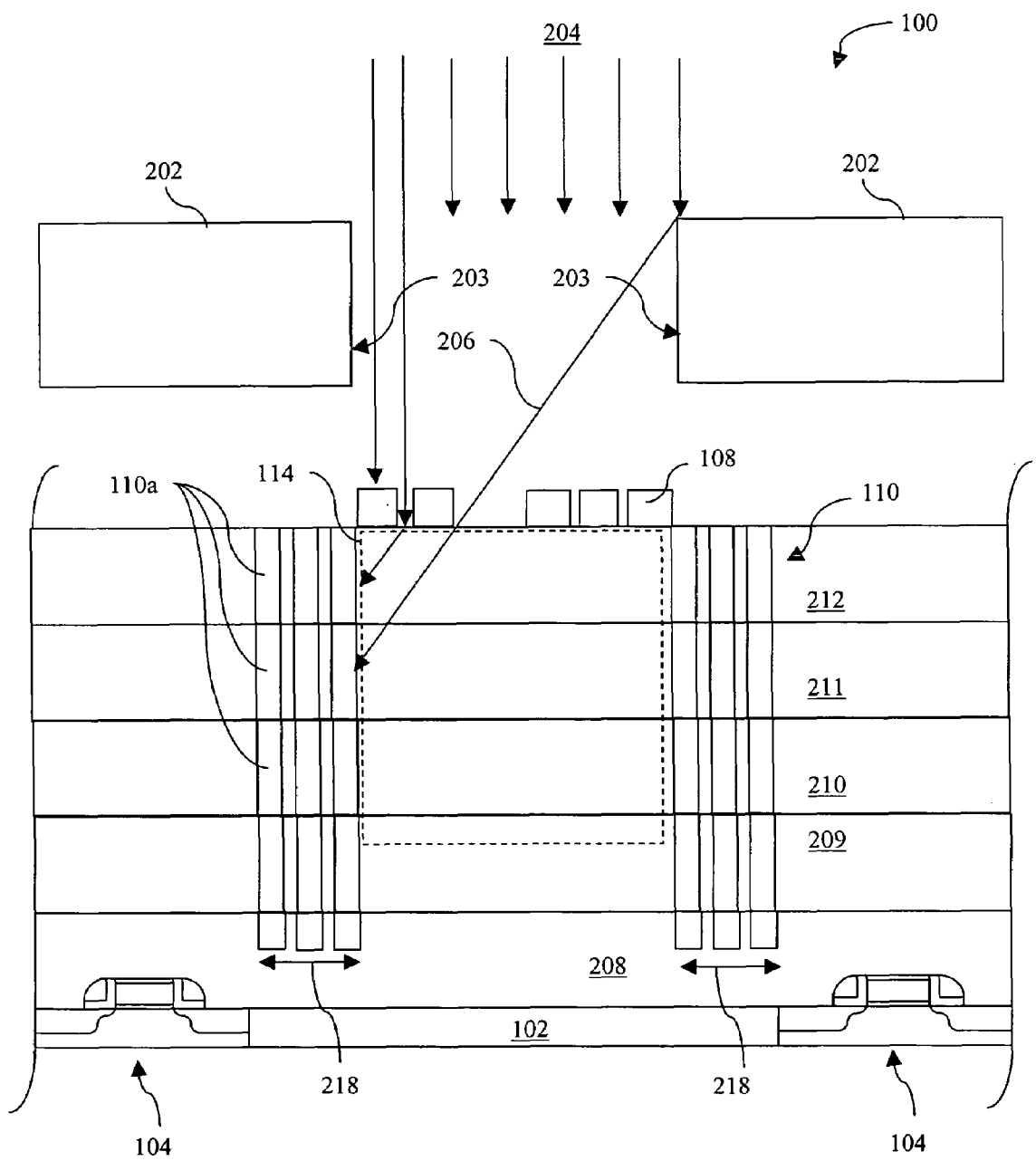
FIG. 2 is a sectional view of the integrated circuit device shown in FIG. 1.

Referring to FIG. 2, illustrated is a sectional view of the integrated circuit device 100 shown in FIG. 1 and demonstrating that the radiation attenuator 110 may be formed in one or more layers of the integrated circuit device 100. For example, a first dielectric layer 208 may be formed over the substrate 102. The first dielectric layer 208 may comprise silicon dioxide, MesoELK® (a product of Schumacher in Carlsbad, Calif.), Black Diamond® (a product of Applied Materials in Santa Clara, Calif.), low-k dielectric materials and/or other dielectric materials, and may be deposited by chemical-vapor deposition (CVD), atomic-layer deposition (ALD), plasma-enhanced CVD (PECVD), physical-vapor deposition (PVD) and/or other processes. In one embodiment, the first dielectric layer 208 is a pre-metal dielectric layer, such as that typically formed over active devices in an integrated circuit device. The integrated circuit device 100 also includes dielectric layers 209–212 formed over the first dielectric layer 208. Each of the additional dielectric layers 209–212 may be substantially similar in composition and manufacture to the first dielectric layer 208. In one embodiment, the additional dielectric layers 209–212 are inter-level dielectric layers, such as those typically formed in an interconnect structure formed over active devices in an integrated circuit device.

As described above, the radiation attenuator 110 may include a plurality of plugs 110a, 110c and/or trenches 110b (hereafter collectively referred to as the plugs 110a). As shown in FIG. 2, the plugs 110a may be segmented, each having portions in one or more of the dielectric layers 208–212. The plugs 110a may comprise copper, tungsten, gold, aluminum, silver, alloys thereof and/or other materials. In one embodiment, the plugs 110a comprise a material or composition having an atomic number greater than about 12.

The plugs 110a may be formed by patterning the dielectric layers 208–212 to form openings therein, possibly by etching and/or ion milling, and subsequently filling the openings with the material desired to form the plugs 110a. As such, portions of the substrate 102 and/or dielectric layers 208–212 may form interstitial dielectric regions interposing the plugs 110a, such that a volume collectively defined by the plugs 110a may comprise less than about 80% dielectric material, or at least about 20% conductive material, although other dielectric-to-conductive material ratios may also be employed.

For example, after patterning the dielectric layers 208–212, the plugs 110a may be formed by CVD, ALD, PECVD, PVD and/or other processes, and in some embodiments high aspect ratio filling processes may be advantageous, such as when the plugs 110a extend un-segmented through more than one of the dielectric layers 208–212. The plugs 110a may also be formed by single and/or dual damascene metallization methods, including single step electroplating processes, CVD and/or PVD seed processes followed by bulk fill by electroplating, PVD seed processes followed by PVD bulk fill processes and/or other methods.

A barrier or cladding may also be employed with the plugs 110a, possibly to improve the adhesion of the plugs 110a within the dielectric layers 208–212. Such cladding materials may comprise refractory metals such as titanium nitride, tantalum nitride, titanium tungsten and/or other materials. In one embodiment, the plugs 110a may be formed during the metallization steps typically employed to form an interconnect structure over active devices in an integrated circuit device.

The composition and dimensions of the radiation attenuator 110 may be dependent upon the type of incident ionizing radiation from which the radiation attenuator 110 is intended to protect the transistors 104. In one embodiment, at least 20% of the volume of the radiation attenuator 110 may be metal, such that the radiation attenuator 110 comprises less than 80% by volume of dielectric material from the dielectric layers 208–212. For example, the volume of the radiation attenuator 110 may be substantially defined by the outer edges 110a' of a group of adjacent plugs 110a. The plugs 110a may be arranged in a circular, rectangular or other geometric pattern within the dielectric layers 208–212. The plugs 110a may have different configurations at each dielectric layer 208–212 or, as shown in FIG. 2, may have the same configuration at each of the dielectric layers 208–212. In one embodiment, the plugs 110a may be vias extending un-segmented through all or a plurality of the dielectric layers 208–212, such that the radiation attenuator 110 may be fabricated after all multi-level metallization in the typical process flow of a conventional integrated circuit device has been completed.

The inductor 108 may be formed over the dielectric layers 208–212 after the attenuation structure 110 is completed. The inductor may comprise Pt, Au, Ag, Cu, Al and/or other materials. The inductor 108 can be fabricated in and/or over the top-most layers of the integrated circuit device 100. The inductor 108 may also be formed prior to forming the radiation region 114. In one embodiment, the inductor 108 is formed by blanket depositing a layer of conductive and/or ferromagnetic material and subsequently etching or otherwise patterning the material, possibly in a spiral pattern resembling the pattern shown in FIG. 1. Of course, the scope of the present disclosure is not limited to the illustrated pattern of the inductor 108, such that other shapes may also or alternatively be employed.

The inductor 108 may also be formed over an air bridge or gap between the inductor 108 and the adjacent layers. Thus, an upper layer of the integrated circuit device 100 on which the inductor 108 is formed, such as the dielectric layer 212, may comprise openings corresponding to portions of the inductor 108 and filled with air or an inert gas. The air gap may provide improved dielectric electrical isolation between the inductor 108 and surrounding features, thereby increasing the quality factor or other electrical characteristic of the inductor 108. The openings or air gaps may be formed by etching or otherwise removing portions of a sacrificial layer or the dielectric layer 212 in a liftoff process before or after forming the inductor 108.

Prior to or after the inductor 108 is formed, the integrated circuit device 100 may be exposed to radiation 204. The exposure to the radiation 204 may be employed to electrically isolate groups of transistors 104, such that the spacing between the groups may be decreased. The exposure to the radiation 204 may also increase the dielectric constant of the dielectric layers 208–212 directly underlying the inductor 108, thereby increasing the quality factor or other electrical characteristic of the inductor 108. In general, the operating parameters that may be employed to expose the device 100 to the radiation 204 may be selected such that the dielectric constant of the radiation region 114 achieves a desired value.

In one embodiment, the radiation process may employ a mask 202 having openings 203 positioned over the substrate 102 such that the openings 203 align with the desired location of the radiation region 114. The mask 202 may be alternatively be formed directly on the surface of one or more layers formed over the substrate 102, such as on the dielectric layer 212, wherein the openings 203 may be formed in the mask 202 by etching or other patterning processes. The mask 202 may comprise Au, Cd, Si, Ni, W, Bi, alloys and combinations thereof. Generally, the mask 202 may comprise a high atomic mass material. However, in embodiments in which the mask 202 is deposited on one or more layers formed over the substrate 102, the mask 202 material may be selected based upon process integration with other processes and materials employed in the manufacture of the integrated circuit device 100. If the mask 202 is deposited rather than suspended over the substrate 102, the mask 102 may be formed by ALD, CVD, PECVD, electroplating, PVD and/or other processes.

The mask 202 may not prevent all of the impinging radiation 204 from reaching the transistors 104, particularly scattered radiation 206 resulting from deflections of the radiation 204 and/or by other secondary radiation as known in the art. As discussed above, such scattered radiation 206 can damage the transistors 104. However, the radiation attenuator 110 may protect the transistors 104 from being damaged by the scattered radiation 206. That is, the radiation attenuator 110 may diffuse the scattered radiation 206 or redirect it to another portion of the device 100 that is less susceptible to radiation damage. The radiation attenuator 110 may also absorb the scattered radiation 206 before it propagates to the transistors 104.

Consequently, the radiation attenuator 110 may also allow a safety spacing 218 between components, such as between the inductor 108 and one or more of the transistors 104, to be reduced. The safety spacing 218 conventionally exists to ensure that sufficient distance is maintained between components adjacent a radiation region, such as the spacing between the radiation region 114 and the transistors 104. That is, the components are conventionally separated from regions exposed to scattered and other secondary radiation a sufficient distance as to not be damaged by the radiation. However, employing the conventional safety spacing to reduce radiation damage to transistors and other components also decreases the packing density of the components. In contrast, by employing the radiation attenuator 114 according to aspects of the present disclosure, the safety spacing 218 may be significantly reduced, thereby allowing an increased packing density of the transistors 104, such that a greater number of transistors 104 may be fabricated on a wafer.

Accordingly, the radiation attenuator 110 may configured based on the energy of the radiation 204. For example, if the energy of the impinging protons of the radiation 204 is about 1 MeV, an effective stopping distance of tungsten may be about 5.3 microns. Consequently, the line width of the radiation attenuator 110, or diameter of the plugs 110a, may be at least about 5.3 microns. In another example, if the energy of the impinging protons is about 30 MeV, the effective stopping distance of tungsten may be about 978.5 microns. Table 1 illustrates exemplary stopping distances (in microns) versus impinging proton energy of the radiation 204 (in MeV) for materials that may be utilized to form the radiation attenuator 110 according to aspects of the present disclosure.

| Energy of H+ (MeV) | Si | Al | Ni | W | Au |
| --- | --- | --- | --- | --- | --- |
| 1 | 15.7 | 14.3 | 6.1 | 5.3 | 5.4 |
| 5 | 213.7 | 189.8 | 72.5 | 57 | 57.9 |
| 15 | 1400 | 1300 | 452.1 | 309.0 | 330 |
| 30 | 4800 | 4300 | 1500 | 978.5 | 1000 |

Figure 3:
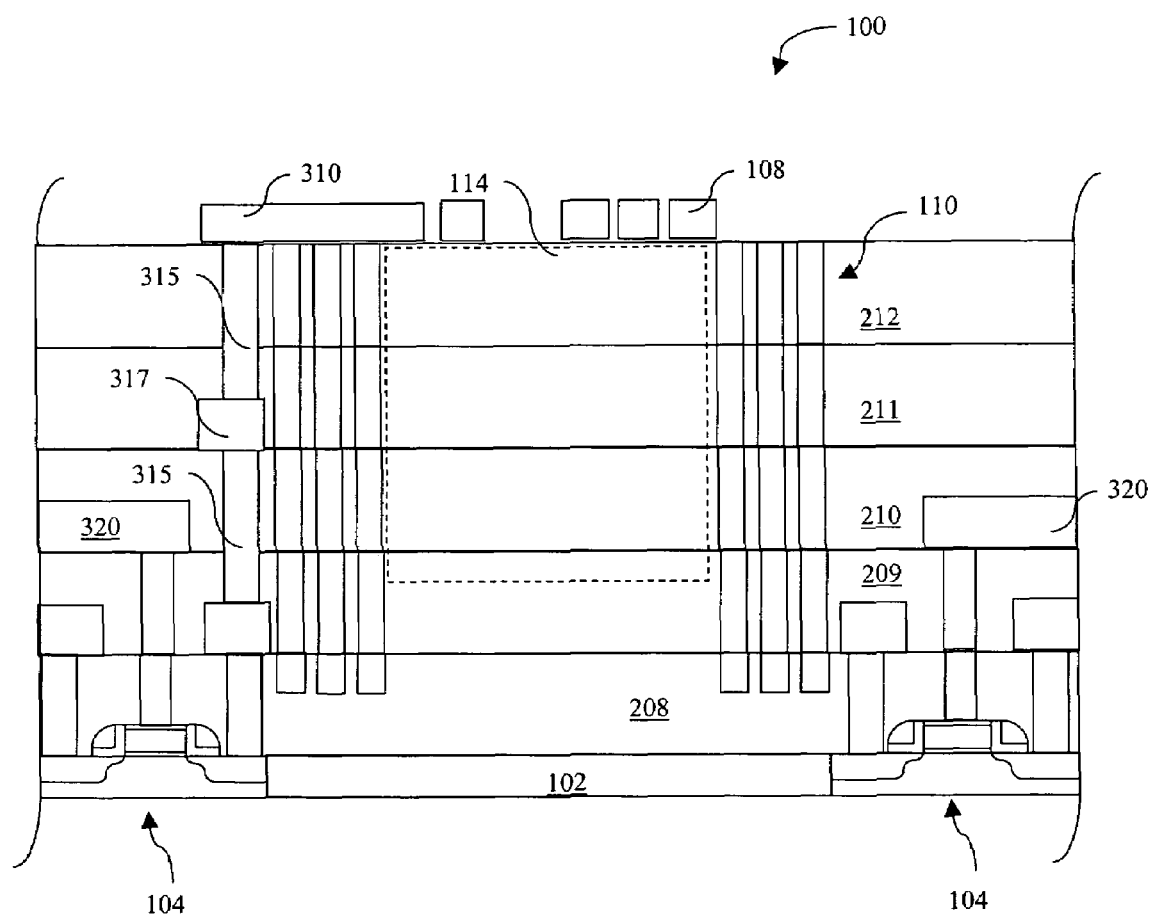
FIG. 3 is a sectional view of another embodiment of an integrated circuit device constructed according to aspects of the present disclosure.

Referring to FIG. 3, illustrated is a sectional view of another embodiment of the integrated circuit device 100 shown in FIGS. 1 and 2. In the embodiment illustrated in FIG. 3, the integrated circuit device 100 includes transistors 104 located at least partially over the substrate 102, the radiation region 114 located at least partially over the substrate 102, the inductor 108 located over the radiation region 114, and a radiation attenuator 110 located between the transistors 104 and the radiation region 114. Each of these elements may be substantially similar in composition, manufacture and function to those shown in FIGS. 1 and 2 and discussed above. However, the embodiment illustrated in FIG. 3 also includes an interconnect 310 electrically connecting one of the transistors 104 and the inductor 108. Vias and/or contacts 315 (hereafter collectively referred to as vias 315) may also be employed for such interconnection. For example, one or more vias 315 may each extend through one or more of the dielectric layers 208–212, possibly being segmented by one or more landings 317, the stacked vias 315 thereby coupling the interconnect 310 and one of the transistors 104. The device 100 may also include other interconnects 320 coupling the transistors 104 to other components, including other transistors 104 in the integrated circuit device 100.

The interconnects 310, 320, the vias 315 and the landings 317 may be of conventional and/or future-developed composition and manufacture. In one embodiment, the interconnects 310, 320, the vias 315 and the landings 317 may be manufactured according to the processes employed to form the radiation attenuator 110, as described above. The interconnects 310, 320, the vias 315 and the landings 317 may also be formed during the processes employed to form the radiation attenuator 110. The interconnect 310 may also be formed by and/or during the processes employed to form the inductor 108, as described above.

Thus, the present disclosure introduces a microelectronics device, including a semiconductor device located at least partially over a substrate, a bombarded area located at least partially over the substrate and adjacent the semiconductor device, and a radiation attenuator interposing the semiconductor device and the bombarded area.

The present disclosure also introduces a method of manufacturing a microelectronics device, including forming a semiconductor device at least partially over a substrate, forming a bombarded area at least partially over the substrate and adjacent the semiconductor device, and forming a radiation attenuator interposing the semiconductor device and the bombarded area.

An integrated circuit device is also provided by the present disclosure. In one embodiment, the integrated circuit includes a plurality of semiconductor devices located at least partially over a substrate, at least one bombarded area located at least partially over the substrate, and at least one inductive element located over the at least one bombarded area. The integrated circuit device also includes at least one radiation attenuator interposing one of the plurality of semiconductor devices and the at least one bombarded area. At least one interconnect electrically connects one of the plurality of semiconductor devices and the at least one inductive element.

Another embodiment of a microelectronics device constructed according to aspects of the present disclosure includes a semiconductor device located at least partially over a substrate, and a bombarded area located at least partially over the substrate and adjacent the semiconductor device, wherein the bombarded area is bombarded by a high energy proton source. A radiation attenuator interposed the semiconductor device and the bombarded area, the radiation attenuator including at least one metal plug comprising tungsten.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronics device, comprising:
a semiconductor device located at least partially over a substrate;
a bombarded area located at least partially over the substrate and adjacent the semiconductor device; and
a bombarded attenuator interposing the semiconductor device and the bombarded area, wherein the bombarded attenuator comprises a plurality of metal plugs;
at least one inductive element located over the bombarded area; and
at least one interconnect electrically connecting the semiconductor device and the at least one inductive element,
wherein the bombarded attenuator substantially encompasses the bombarded area.

2. The device of claim 1 wherein the plurality of metal plugs comprises a plurality of metal-filled trenches.

3. The device of claim 1 wherein ones of the plurality of metal plugs are randomly located relative to adjacent ones of the plurality of metal plugs.

4. The device of claim 1 wherein ones of plurality of metal plugs are uniformly spaced from adjacent ones of the plurality of metal plugs.

5. The device of claim 1 wherein ones of the plurality of metal plugs comprise a material having an atomic number greater than about 12.

6. The device of claim 1 wherein ones of the plurality of metal plugs comprise tungsten.

7. The device of claim 1 wherein interstitial dielectric regions interpose the plurality of metal plugs, and wherein less than about 80% of a volume collectively defined by the plurality of metal plugs comprises a dielectric material.

8. The device of claim 7 wherein the volume has an annulus shape.

9. The device of claim 1 wherein the plurality of metal plugs comprises a trench containing metal.

10. The device of claim 1 wherein the substrate comprises GaAs.

11. The device of claim 1 wherein the substrate comprises diamond.

12. The device of claim 1 wherein:
the bombarded area has been bombarded by a high energy proton source; and
at least one of the plurality of metal plugs comprises tungsten.

13. The device of claim 12 wherein the bombarded area is a region of a material located over the substrate, the region having a first resistivity that is substantially greater than a second resistivity of adjacent portions of the material.

14. The device of claim 12 wherein the a plurality of metal plugs comprises a plurality of metal-filled trenches.

15. A microelectronics device, comprising:
a semiconductor device located at least partially over a substrate;
a dielectric layer located over the substrate;
a bombarded area located in the dielectric layer and adjacent the semiconductor device;
a bombarded attenuator interposing the semiconductor device and the bombarded area, wherein the bombarded attenuator substantially encompasses the bombarded area and comprises a plurality of metal plugs;
an inductive element located over the bombarded area; and
an interconnect electrically connecting the semiconductor device and the inductive element.

16. The device of claim 15 wherein ones of the plurality of metal plugs are randomly located relative to adjacent ones of the plurality of metal plugs.

17. The device of claim 15 wherein ones of plurality of metal plugs are uniformly spaced from adjacent ones of the plurality of metal plugs.

18. The device of claim 15 wherein ones of the plurality of metal plugs comprise a material having an atomic number greater than 12.

19. The device of claim 15 wherein ones of the plurality of metal plugs comprise tungsten.

20. The device of claim 15 wherein interstitial dielectric regions interpose the plurality of metal plugs, and wherein less than about 80% of a volume collectively defined by the plurality of metal plugs comprises a dielectric material.

21. The device of claim 20 wherein the volume has an annulus shape.

22. The device of claim 15 wherein the substrate comprises at least one of GaAs and diamond.

23. The device of claim 15 wherein the bombarded area is a region of a material located over the substrate, the region having a first resistivity that is substantially greater than a second resistivity of adjacent portions of the material.

* * * * *